United States Patent [19]
Ishikawa et al.

[11] Patent Number: 6,096,480
[45] Date of Patent: *Aug. 1, 2000

[54] PHOTOSENSITIVE POLYIMIDOSILOXANE COMPOSITIONS AND INSULATING FILMS MADE THEREOF

[75] Inventors: Seiji Ishikawa; Hiroshi Yasuno; Hiroyuki Sakurai, all of Ichihara, Japan

[73] Assignee: Ube Industries, Ltd., Ube, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/985,872

[22] Filed: Dec. 5, 1997

Related U.S. Application Data

[63] Continuation-in-part of application No. 08/687,035, Jul. 25, 1996, abandoned.

[30] Foreign Application Priority Data

Jul. 28, 1995 [JP] Japan ................................... 7-192794
Jun. 11, 1996 [JP] Japan ................................... 8-149050

[51] Int. Cl.$^7$ .................................................. G03F 7/038
[52] U.S. Cl. ........................ 430/283.1; 522/99; 525/421; 528/26
[58] Field of Search ........................ 430/283.1; 522/99; 525/421; 528/26

[56] References Cited

U.S. PATENT DOCUMENTS

| | | |
|---|---|---|
| 4,586,997 | 5/1986 | Lee . |
| 4,595,745 | 6/1986 | Nakano et al. . |
| 5,102,773 | 4/1992 | Littmann et al. ..................... 430/283.1 |
| 5,472,823 | 12/1995 | Hagiwara et al. ..................... 430/270.1 |
| 6,001,534 | 12/1999 | Kato ..................... 430/283.1 |

OTHER PUBLICATIONS

English Transaction of Japanese Kokai Patent Application 3–71633, by United States Patent and Trademark Office, Jul. 1997 (PT097–4442), Mar. 27, 1991.
European Patent Application No. 0,459,809 to Nakajima et al. dated Dec. 4, 1991.
Japanese Laid Open Patent Publication No. 8–76376 to Shinetsu Kagaku Kogyo K.K. dated Mar. 22, 1996 (including an English language description).
Japanese Laid Open Patent Publication No. 57–131227 to Sugihara dated Aug. 14, 1982 (including an English language abstract).
Japanese Laid Open Patent Publication No. 2–50161 to Nobuyuki et al. dated Feb. 20, 1990 (including an English language abstract).
Japanese Laid Open Patent Publication No. 4–252227 to Eguchi dated Sep. 8, 1992 (including an English language abstract).
Patent Abstracts of Japan, vol. 14, No. 219, p. 1045, Sumitomo Bakelite Co., Ltd., "Photosensitive Resin Composition," Publication No. 2–50161, Feb. 20, 1990.
Japanese Laid Open Patent Publication No. 3–71633 to Takeuchi et al., dated Mar. 27, 1991.
Japanese Laid Open Patent Publication No. 6–11832 to Okunoyama dated Jan. 21, 1994.
Takeuchi et al. 115:172528, *Chemical Abstracts*, on line from Columbis, Ohio of JP 6–11832, published Jan. 21, 1994 with Registry No. 26374–94–4, 535–87–5, and 1823–59–2, on line, cited in Abstract.
Takeuchi et al., 03–71633, *Patent Abstract of Japan*, Abstract Group No. E1078, vol. 15, No. 236, Abstract published Jun. 18, 1991 of JP 3–71633.
Takeuchi et al., AN 91–135616, Derwent Information Ltd., on line English Abstract of JP 3–761633A.

*Primary Examiner*—Cynthia Hamilton
*Attorney, Agent, or Firm*—Finnegan, Henderson, Farabow, Garrett & Dunner, L.L.P.

[57] ABSTRACT

A photosensitive polyimidosiloxane composition comprising a polyimidosiloxane comprising 15–80 mole percent of the units,

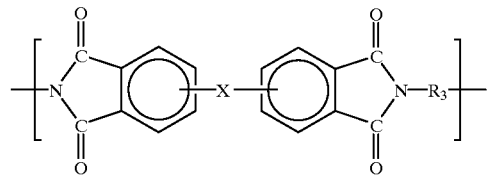

wherein X represents CO, O or a direct bond and $R_3$ represents an aromatic residue containing a photosensitive group with an unsaturated hydrocarbon group, and 85–20 mole percent of the units,

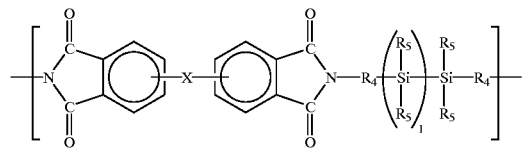

wherein X is as defined above, each $R_4$ independently represents a divalent hydrocarbon residue, each $R_5$ independently represents an alkyl group of 1–3 carbon atoms and 1 represents an integer of 3–30, a finely divided inorganic filler, and an organic solvent. The composition provides films having excellent light transmittance.

12 Claims, No Drawings

PHOTOSENSITIVE POLYIMIDOSILOXANE COMPOSITIONS AND INSULATING FILMS MADE THEREOF

CROSS-REFERENCE TO RELATED APPLICATION

This is a continuation-in-part of application Ser. No. 687,035, filed on Jul. 25, 1996, now abandoned.

BACKGROUND OF THE INVENTION

1. Field of the Invention

The present invention relates to novel aromatic polyimidosiloxanes with excellent solubility in organic solvents and containing photosensitive groups in their main polymer chains. More specifically, the present invention relates to organic solvent-soluble photosensitive polyimidosiloxanes providing photocured products with excellent heat resistance, electrical properties and mechanical properties including flexibility, which are suitable as overcoat materials for flexible wiring boards, interlayer insulating materials, or materials for forming insulating films on solid elements and passivation films for industrial semiconductors.

2. Description of the Related Art

Overcoat materials for flexible wiring boards, interlayer insulating films for multilayer boards, materials for forming insulating films on solid elements and passivation films for industrial semiconductors, as well as interlayer insulating materials for semiconductor integrated circuits and multilayer printed wiring boards, require excellent heat resistance and insulating properties, and photosensitive heat resistant materials are being sought to meet the demand for high density and high integration.

A number of ideas have been devised for forming such insulating films of polyimides, due to their high heat resistance and insulating properties.

However, commonly used polyimides are either insoluble in solvents and have no photosensitive groups, or the polymers containing photosensitive groups are all in the form of polyimide precursors, i.e. polyamic acids, modified by amidation or esterification of the carboxylic acid, and must have the polyamic acids converted into polyimides during photocuring, or be post-baked into polyimides after photocuring.

There also exist heat-resistant photoresist compositions prepared by mixing organic solvent-soluble polyimides (without photosensitive groups) with monomers which contain a photocurable group and subjecting the mixture to photocuring (see, for example, Japanese Unexamined Patent Publication No. 54-109828), but such compositions have inferior photocuring properties, while the heat resistance of the polyimides after photocuring is insufficient. In addition, since aromatic polyimides with superior heat resistance generally have inferior solubility in solvents, they are not suitable for the formation of relief patterns which involves a step of dissolving the unexposed parts after photocuring.

Ideas have also been proposed for obtaining polyimides with excellent photosensitivity and heat resistance by reacting a tetracarboxylic dianhyride with a diamine compound containing a photocrosslinkable unsaturated double bond, such as diaminochalcone (see, for example, Japanese Unexamined Patent Publication No. 57-131227).

However, although polyimides obtained in this manner have excellent photosensitivity, their inferior solubility in organic solvents results in longer times required for dissolution, thus constituting a practicality problem for the formation of relief patterns.

Polyimidosiloxanes have also been proposed in order to obtain flexible photosensitive polyimides (Japanese Unexamined Patent Publication Nos. 2-50161, 4-252227), but since polyamic acids are used as the polymer components, high-temperature heating is necessary after patterning to accomplish imidation, thus constituting a practicality problem in that thermal damage can occur in the board.

SUMMARY OF THE INVENTION

It is an object of the present invention to provide a photosensitive polyimidosiloxane composition having substantially no practicality problems.

It is another object of the present invention to provide an electrical insulating film with satisfactory resolution, which can be formed to a large thickness and requires no high-temperature heating (250–400° C.) for imidation after patterning.

The present invention provides a photosensitive polyimidosiloxane composition comprising:

a polyimidosiloxane comprising 15–80 mole percent of the units,

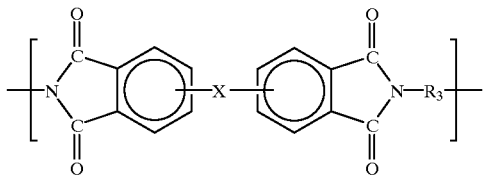

wherein X represents CO, O or a direct bond and $R_3$ represents an aromatic residue containing a photosensitive group with an unsaturated hydrocarbon group, and 85–20 mole percent of the units,

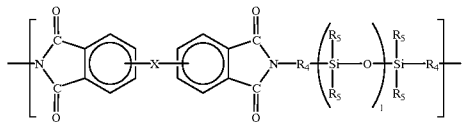

wherein X is as defined above, each $R_4$ independently represents a divalent hydrocarbon residue, each $R_5$ independently represents an alkyl group of 1–3 carbon atoms and l represents an integer of 3–30, a finely divided inorganic filler, and an organic solvent, the photocured product of said photosensitive polyimidosiloxane composition exhibiting excellent light transmittance.

The present invention also provides an insulating film obtained from the photosensitive polyimidosiloxane composition according to the present invention, which has a thickness of 2–50 μm and a resolution of at least 10 μm after photocuring by irradiation with a superhigh-pressure mercury lamp (2 kW) on a dried film prepared from the photosensitive polyimidosiloxane composition.

DESCRIPTION OF THE PREFERRED EMBODIMENTS

The polyimidosiloxane usable for the photosensitive polyimidosiloxane composition according to the present invention may be prepared by polymerization and imidation of substantially equimolar amounts of:

an aromatic tetracarboxylic dianhydride component represented by the following general formula (1)

(1)

wherein $R_1$ and $R_2$ each represent mononuclear aromatic residues with acid anhydride groups and X is as defined above, and a diamine component consisting of 15–80 mole percent of an aromatic diamine compound containing a photosensitive group, represented by the following general formula (2)

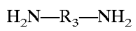

(2)

wherein $R_3$ is as defined above, and 85–20 mole percent of a diaminopolysiloxane represented by the following general formula (3)

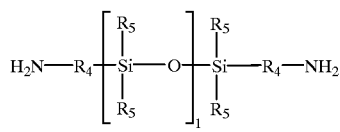

(3)

wherein $R_4$, $R_5$ and l are as defined above.

The polyimidosiloxanes may be produced by random or block polymerization of substantially equimolar amounts of an aromatic tetracarboxylic dianhydride and two types of diamine components, represented by the general formulas given above, in an organic solvent, followed by chemical imidation of the resulting polyamic acid.

The aromatic tetracarboxylic dianhydride represented by general formula (1) above may be a biphenyltetracarboxylic dianhydride, benzophenonetetracarboxylic dianhydride or oxydiphthalic anhydride, preferred among which are 3,3',4, 4'-benzophenonetetracarboxylic dianhydride and 2,3,3',4'-biphenyltetracarboxylic dianhydride (a-BPDA).

The photosensitive group-containing aromatic diamine represented by general formula (2) above may be any aromatic diamine with a photosensitive unsaturated hydrocarbon group, examples of which include unsaturated benzoic acid esters such as 3,5-diaminobenzoic ethylacrylic acid ester, 2,4-diaminobenzoic ethylacrylic acid ester, 3,5-diaminobenzoic ethylmethacrylic acid ester, 2,4-diaminobenzoic ethylmethacrylic acid ester, 3,5-diaminobenzoic glycidylacrylate ester, 2,4-diaminobenzoic glycidylacrylate ester, 3,5-diaminobenzoic glycidylmethacrylate ester, 2,4-diaminobenzoic glycidylmethacrylate ester, 3,5-diaminobenzoic cinnamyl ester and 2,4-diaminobenzoic cinnamyl ester; benzyl (meth)acrylates such as 3,5-diaminobenzyl acrylate and 3,5-diaminobenzyl methacrylate; unsaturated diphenylether esters such as 4-acrylamido-3,4'-diaminodiphenyl ether, 2-acrylamido-3, 4'-diaminodiphenyl ether, 2-acrylamido-3,4'-diaminodiphenyl ether, 4-cinnamamido-3,4'-diaminodiphenyl ether, 3,4'-diacrylamido-3',4-diaminodiphenyl ether, 3,4'-dicinnamamido-3',4-diaminodiphenyl ether, 4-methyl-2'-carboxyethylmethacrylic acid ester-3,4'-diaminodiphenyl ether [carboxyethylmethacrylic acid ester: $CH_2=C(CH_3)COOCH_2CH_2OOC-$], and 4-methyl-2'-carboxyethylacrylic acid ester-3,4'-diaminodiphenyl ether [carboxyethylacrylic acid ester: $CH_2=CHCOOCH_2CH_2OOC-$]; and substituted or unsubstituted diaminochalcones such as 4,4'-diaminochalcone, 3,3'-diaminochalcone, 3,4'-diaminochalcone, 3',4-diaminochalcone, 4'-methyl-3',4-diaminochalcone, 4'-methoxy-3',4-diaminochalcone and 3'-methyl-3,5-diaminochalcone.

A single photosensitive group-containing aromatic diamine represented by general formula (2) above may be used, or 2 or more thereof may be used in combination.

The diaminopolysiloxane represented by general formula (3) above preferably is one wherein $R_4$ in general formula (3) is a divalent hydrocarbon residue, preferably a "polymethylene" group of 2–6 carbon atoms, particularly 3–5 carbon atoms, or a phenylene group, $R_5$ is independently an alkyl group of 1–3 carbon atoms such as a methyl, ethyl, propyl or a phenyl group, and l is 3–30, especially 5–20. So long as l is in the aforementioned range (3–30), the diaminopolysiloxane represented by general formula (3) may be a homogeneous compound, or it may be a mixture of compounds with different values for l. In the case of a mixture, the average value for l is preferably in the range of 5–20, as calculated based on amino equivalents.

According to the present invention, the diamine components may be a photosensitive group-containing aromatic diamine represented by general formula (2) above and a diaminopolysiloxane represented by general formula (3) above, and the aromatic diamine represented by general formula (2) may be used in a proportion of 15–80 mole percent, preferably 20–70 mole percent, and the diaminopolysiloxane represented by general formula (3) in a proportion of 85–20 mole percent, preferably 80–30 mole percent.

If the proportion of the photosensitive group-containing aromatic diamine represented by general formula (2) is less than the minimum given above, then the photosensitivity of the resulting photosensitive polyimidosiloxane may be reduced, a high resolution electrical insulating film may not be obtained after photocuring, and the thermal decomposition temperature of the photosensitive polyimidosiloxane may be lowered. If the proportion of the photosensitive group-containing aromatic diamine represented by general formula (2) is greater than the maximum given above, then the organic solubility of the resulting photosensitive polyimidosiloxane may be reduced.

Other aromatic diamines may also be used in addition to the diamines represented by general formulas (2) and (3). These are preferably used at not more than 65 mole percent, more preferably not more than 30 mole percent of the diamine component. Other suitable aromatic diamines include, for example, aromatic diamines with two benzene rings such as 4,4'-diaminodiphenyl ether, 4,4'-diaminodiphenylmethane, 4,4'-diaminodiphenylsulfone and o-tolidine; aromatic diamines with 3 benzene rings such as 1,4-bis(4-aminophenoxy)benzene and 1,4-bis(4-aminophenyl)benzene; and aromatic diamines with 4 benzene rings such as bis[4-(4-aminophenoxy)phenyl]sulfone and 2,2-bis[4-(4-aminophenoxy)phenyl]propane.

The photosensitive polyimidosiloxane may preferably be obtained by first subjecting an aromatic tetracarboxylic dianhyride component and a substantially equimolar amount of a diamine component to a random or block polymerization reaction, preferably a random polymerization reaction, for about 1–48 hours in an organic solvent at a reaction temperature of 100° C. or lower, preferably at a reaction temperature of 10–80° C., and then diluting the polyamic acid solution resulting from the polymerization reaction with an organic solvent, and adding a chemical imidating agent, for example a carboxylic anhydride such as acetic anhydride or a tertiary amine such as pyridine, at a temperature of 100° C. or lower, preferably at a reaction temperature of 10–50° C., for imidation reaction for about 0.1 to 5 hours.

The organic solvent used for the above-mentioned polymerization reaction and imidation reaction may be, for example, N,N-dimethylsulfoxide, N,N-dimethylformamide, N,N-diethylformamide, N,N-dimethylacetoamide, N,N-diethylacetoamide, N-methyl-2-pyrrolidone (NMP) or hexamethylenephosphoamide.

Alternatively, the photosensitive polyimidosiloxane may be prepared by polymerization and imidation of an aromatic tetracarboxylic dianhydride component represented by the above-mentioned general formula (1), an aromatic diamine component having a —OH or —COOH group such as 3,3'-dihydroxy-4,4'-diaminodiphenyl ether or 5,5'-methylene-bis[2-aminobenzoic acid] and a diaminopolysiloxane represented by the above-mentioned general formula (3) to form a polyimide, and reaction of the resulting polyimide with a (meth)acryloyl compound such as glycidyl methacrylate, glycidyl acrylate or, preferably, a half-epoxy (meth)acrylate (the half number of epoxy groups of an epoxy compound having about 10 epoxy groups are replaced by (meth)acrylate groups) under an inert gas atmosphere such as $N_2$ at a low temperature.

The photosensitive polyimidosiloxane may be used without modification, or depending on the use, for example when used as a pattern-forming material, it is preferably used as a solution in an organic solvent.

The aforementioned organic solvent used for the photosensitive polyimidosiloxane composition according to the present invention may be a sulfoxide-based solvent such as dimethylsulfoxide or diethylsulfoxide, a formamide-based solvent such as N,N-dimethylformamide or N,N-diethylformamide, an acetoamide-based solvent such as N,N-dimethylacetoamide or N,N-diethylacetoamide, a pyrrolidone-based solvent such as N-methyl-2-pyrrolidone, N-ethyl-2-pyrrolidone or N-vinyl-2-pyrrolidone, a glyme-based solvent such as methyldiglyme or methyltriglyme, or hexamethylphosphoric triamide, γ-butyllactone or cyclohexanone.

The polymer solid concentration in the photosensitive polyimidosiloxane composition of the invention is preferably 20–50 wt %.

A sensitizer and photopolymerization initiator as well as an adhesion-improving agent such as a thermosetting resin or melamine resin and an air-shutting agent such as vaseline or paraffin wax are preferably also added to the photosensitive polyimidosiloxane composition.

A photopolymerizable compound with an ethylenic unsaturated group may also be added within a range which does not impair the properties of the insulating film after photocuring.

The aforementioned sensitizer or photopolymerization initiator may be Michler's ketone, benzoin, benzoin methyl ether, benzoin ethyl ether, benzoin isopropyl ether, 2-t-butylanthraquinone, 1,2-benzo-9,10-anthraquinone, 4,4'-bis(diethylamino)benzophenone, acetophenone, benzophenone, thioxanthone, 1,5-acenaphthene, 1-hydroxycyclohexylphenyl ketone, 2-benzyl-1,2-dimethylamino-1-(4-morpholinophenyl)butane-1,1-hydroxy-cyclohexylphenyl ketone, etc., and these are preferably added in a total of 1–50 parts by weight, and especially 10–50 parts by weight, with respect to 100 parts by weight of the polyimidosiloxane.

The above-mentioned photopolymerizable compound having an ethylenic unsaturated group may be ethyleneglycol di(meth)acrylate, propyleneglycol di(meth)acrylate, trimethylolpropane tri(meth)acrylate, tetramethylolmethane tetra(meth)acrylate, N,N'-methylene bis(meth)acrylate, diethylaminoethyl (meth)acrylate, 1,3,5-triacryloylhexahydro-s-triazine, tris(hydroxyethylacryloyl) isocyanate, (meth)acryloxyethyl phosphate or bis[(meth)acryloxyethyl]phosphate.

The photosensitive polyimidosiloxane composition of the invention contains a finely divided inorganic filler such as Wallastonite, silica, talc or calcium carbonate powder preferably in an amount of 10–100 parts by weight per 100 parts by weight of the photosensitive polyimidosiloxane.

A pattern may be formed by using the photosensitive polyimidosiloxane composition as mentioned above.

For example, the above-mentioned photosensitive polyimidosiloxane composition may be first applied onto a board and then dried to remove the organic solvent. The application onto the board may be accomplished by screen printing, a curtain roll, a reverse roll, or the like. The applied film (preferably with a thickness of 5–100 $\mu$m, and especially 10–100 $\mu$m) is dried at 90° C. or lower, and preferably 40–80° C. After drying, a negative photomask is placed on the dried applied film which is then irradiated with activating light rays such as ultraviolet rays, visible light rays or electron rays. A polyimidosiloxane pattern may then be obtained by washing the unexposed portions with a developing agent using a shower or ultrasonic waves. The thickness of the cured film is preferably about 2–50 $\mu$m.

The developing agent may be an organic solvent such as N,N-dimethylformamide, N,N-dimethylacetoamide, dimethylsulfoxide, N-methyl-2-pyrrolidone, hexamethylenephosphoamide, diglyme, triglyme, or a mixture thereof with methanol, ethanol or the like.

The photosensitive polyimidosiloxane as mentioned above is very readily soluble, and thus the polyimidosiloxane in the unexposed portions is easily removed to allow ready formation of a pattern.

Many other excellent effects are provided, in that since the photosensitive polyimidosiloxane composition of the invention have high photosensitivity and excellent light transmittance and photocrosslinkability, there is no need for a separate resist for image formation as with non-photosensitive polyimides of the prior art, and since there is no need for high-temperature heating (250–400° C.) for imidation after image formation as with photosensitive polyamic acids, an after-heating step at 150–200° C. being sufficient, not only are high reliability and lower cost afforded, but thermal damage to the boards is also avoided. The photosensitive polyimidosiloxane composition of the invention may therefore be suitably used for the formation of both negative patterns and positive patterns.

Furthermore, patterns made with cured films formed from photosensitive polyimidosiloxane compositions of the invention have excellent heat resistance and electrical and mechanical properties, and especially excellent flexibility. For example, an insulating film according to the invention, suitably with a thickness of about 2–50 $\mu$m, has a post-photocuring resolving power of at least 10 $\mu$m, and usually about 10–1000 $\mu$m. Thus, the insulating film according to the invention is particularly suited as an insulating material for high-density flexible boards.

Examples of the present invention will now be provided.

Evaluation of the following examples was conducted in the following manner.

(Property tests)

1. Inherent viscosity

The inherent viscosity (In η/c) was measured at 30° C. in a solution containing 0.5 g of a polymer in 100 ml of N-methyl-2-pyrrolidone.

2. Polyimidosiloxane film formability

A solution of 20 g polyimidosiloxane dissolved in 100 ml N-methyl-2-pyrrolidone was applied onto a Teflon plate (1.0 mm) to a polyimidosiloxane film thickness of approximately 20 μm and dried at 70° C. for 30 minutes, and the occurrence of cracks upon heating at 160° C. for 60 minutes and 180° bending was observed. Absence of cracking was indicated by "○", and cracking was indicated by "×".

3. Solubility of polyimidosiloxane in NMP

A 0.2 g portion of polyimidosiloxane was added to 0.8 g of N-methyl-2-pyrrolidone, and the state of dissolution of the polyimidosiloxane was observed, indicating dissolution for up to 1 hour by "*", dissolution for up to one day by "○", swelling alone by "Δ", and no dissolution by "×".

4. Thermal decomposition temperature

This was measured using a thermogravimetric analyzer.

5. Evaluation of photocuring property

A dam was constructed using a polyimide film as the spacer, a bar coater was used for uniform casting of ink on copper foil (35 μm), and the dried film obtained from drying at 70° C. for 30 minutes was subjected to the photosensitivity and resolving power tests described below.

Photosensitivity

The dried film was irradiated using a superhigh-pressure mercury lamp (2 kW) at an illuminance of 7 mW/cm$^2$, and the amount of light irradiation required for photocuring was recorded.

Resolution

A negative film (a test pattern containing an equally-spaced figure pattern having a line width and spacing of 0.075–2.0 mm) was placed on the dried film, and a superhigh-pressure mercury lamp (2 kW) was used to produce a prescribed degree of irradiation for photocuring, after which it was immersed in a triglyme solvent and the uncured portions were washed off, the surface was washed with methanol to obtain a relief pattern adhering to the polyimide film which was then heat treated at 160° C. for 120 minutes, and the resolution of the pattern was measured.

6. Measurement of mechanical properties

The photosensitive polyimidosiloxane composition was coated onto a polytetrafluoroethylene film and dried at 70° C. for 30 minutes, and after subsequent 1 J/cm$^2$ ultraviolet light exposure and heating at 200° C. for one hour, the film was peeled off, a dumbbell-shaped test piece was cut out, and a tension tester was used for measurement according to ASTM D882 to determine the tensile strength, elongation rate and initial elastic modulus.

7. Electrical properties

The photosensitive polyimidosiloxane composition was applied onto a 0.3 mm-thick copper plate and dried at 70° C. for 30 minutes, and the sample obtained by subsequent 1 J/cm$^2$ ultraviolet light exposure and heating at 200° C. for one hour was subjected to testing based on JIS C 2103 (electrical insulation varnish test method).

EXAMPLE 1

(Amic acid synthesis step)

After addition of 25.06 g (0.085 mol) of 2,3,3',4'-biphenyltetracarboxylic dianhydride (a-BPDA) and 108 g NMP to a 1 liter-volume reactor equipped with a dropping funnel and a nitrogen admission tube, and thorough dissolution, 1.2 g of hydroquinone and 1.2 g of 4-methoxyhydroquinone were added as anti-gelating agents. The solution was cooled with dry ice/methanol (–30° C.) while circulating drying air, after which 6.0 g (0.023 mol) of 3,5-diaminobenzoic ethylmethacrylic acid ester [melting point: 88–89° C., elemental analysis (found, %): C: 59.36, H: 6.08, N: 10.49] and 54.0 g (0.062 mol) diaminopolysiloxane [$R_4$ being propyl, $R_5$ being methyl and l being 10 in general formula (3); amino equivalents: 435] were added over 3 to 5 minutes. The equipment was washed in the apparatus with 40 g NMP. External cooling was followed by stirring at 25–28° C. for 20–30 minutes to obtain a polyamic acid solution.

(Chemical imidation step)

A 472 g portion of NMP was then added to the same reactor to dilute the reaction solution. Next, 145.2 g acetic anhydride and 62.2 g pyridine were added with the dropping funnel over 10 minutes at 25–28° C. while externally cooling, and the mixture was stirred overnight at 18–22° C. to obtain the imidated solution.

(Precipitation/filtration/washing/drying step)

The above-mentioned imidated solution was precipitated using a disperser for 2 minutes in a 3-liter container containing 1.5 liters of methanol.

The precipitate was filtered out using filter paper (No.3, product of Advantech) and washed with a small amount of methanol. This procedure was repeated 3 times, after which the filtrated solid was vacuum-dried (25° C., 15 minutes) to obtain 85.5 g of a photosensitive polyimidosiloxane.

(Inking step)

After dissolving 30 g of the above-mentioned photosensitive group-containing polyimidosiloxane in 45 g NMP, 5.25 g of Aerosil (average particle size: approx. 0.02 μm), 12 g of talc (average particle size: 1.5 μm), 6.92 g of 1-hydroxycyclohexylphenyl ketone and 6.92 g of 2-benzyl-1,2-dimethylamino-1-(4-morpholinophenyl)butane-1 were added thereto and mixed. The mixture was kneaded with a triple roller to obtain an ink/photosensitive polyimidosiloxane solution composition.

The results from evaluation of the photosensitive polyimidosiloxane solution composition are summarized in Table 2.

Measurement of the mechanical properties of the exposed and heat-treated film revealed a tensile strength of 0.93 kg/mm$^2$, an elongation of 9% and an initial elastic modulus of 33 kg/mm$^2$.

Measurement of the electrical properties of the exposed and heat-treated film revealed a volume resistance value of $9.2 \times 10^{14}$ Ω·cm.

When the soldering heat resistance of the insulating film was evaluated by conventional methods, no problems were found up to 300° C.

EXAMPLE 2

A photosensitive polyimidosiloxane was obtained in the same manner as Example 1, except that benzophenonetetracarboxylic dianhydride (BTDA) was used instead of 2,3, 3',4'-biphenyltetracarboxylic dianhydride.

A photosensitive polyimidosiloxane solution composition (ink) was then obtained in the same manner as described in Example 1.

When the soldering heat resistance of the photocured photosensitive polyimidosiloxane (insulating film) was evaluated by conventional methods, no problems were found up to 300° C.

The results of evaluation of the other properties are summarized in Tables 1 and 2.

EXAMPLES 3–5

Photosensitive polyimidosiloxanes were obtained in the same manner as Example 1, except that the photosensitive group-containing aromatic diamines listed in Table 1 were used instead of the 3,5-diaminobenzoic ethylmethacrylic acid ester of Example 1.

Photosensitive polyimidosiloxane solution compositions (inks) were then obtained in the same manner as described in Example 1.

The soldering heat resistance of the insulating films obtained from the photosensitive polyimidosiloxane solutions were evaluated by conventional methods. No problems were found in any of these up to 300° C.

The results of evaluation of the other properties are summarized in Tables 1 and 2.

COMPARATIVE EXAMPLE 1

A photosensitive polyimidosiloxane was obtained in the same manner as Example 1, except that no diaminosiloxane was used. The resulting photosensitive polyimidosiloxane was insoluble in N-methylpyrrolidone, and thus measurement of the photocuring properties could not be made.

COMPARATIVE EXAMPLE 2

A photosensitive polyimidosiloxane was obtained in the same manner as Example 1, except that pyromellitic dianhydride was used instead of 2,3,3',4'-biphenyltetracarboxylic dianhydride (PMDA).

The resulting photosensitive polyimidosiloxane merely swelled in N-methylpyrrolidone, making it impossible to obtain an ink solution and measure the photocuring properties.

COMPARATIVE EXAMPLE 3

Production of base polymer

A polyimidosiloxane solution was obtained by reacting 17.140 g (0.0582 mol) a-BPDA, 26.16 g (0.0291 mol) diaminopolysiloxane (450 amino equivalents) and 4.424 g (0.0291 mol) diaminobenzoic acid in 54 g NMP at 170° C. for 3 hours.

Epoxy reaction

A 17 g portion of the above-mentioned polyimidosiloxane solution was taken (0.011 mol of diaminobenzoic acid), 4.51 g (0.032 mol) of glycidyl methacrylate in a 3-fold amount with respect to carboxyls was added, and the reaction was conducted at 90° C. for 3 hours while circulating dry air. The resulting epoxy-modified solution was blackish brown.

Mixing

With 25.0 g of the epoxy modified solution (12.7 g solid portion) there were mixed 3.8 g of talc, 2.5 g of Aerosil 200, 0.38 g of DB-100, 0.97 g of Irgacure 369 and 1.95 g of Irgacure 184, to obtain a photosensitive polyimidosiloxane solution composition (ink) of a color shade of blackish brown.

Evaluation of photocuring properties

After forming a film from the photosensitive polyimidosiloxane solution in the same manner as Example 1, it was photocured by irradiation with 1.0 J/cm² ultraviolet light and then immersed in a triglyme solvent, and upon exposure of the uncured portions to ultrasonic waves and washing off of the unexposed portions, floating of the film and surface roughness were observed.

EXAMPLE 6

The photosensitive polyimidosiloxane solution (ink) of Example 1 was used for a separate resolving power evaluation according to the following method.

Test pattern

A glass mask test pattern (positive pattern) was used for the resolving power test. The pattern had sizes of 4 $\mu$m$\phi$, 6 $\mu$m$\phi$, 8 $\mu$m$\phi$, 10 $\mu$m$\phi$ and 15 $\mu$m$\phi$.

Film formation

Spin coating was used for the application, with drying at 60° C.×30 minutes, light exposure at 0.21 J/cm² and development in an ultrasonic wave bath (triglyme solvent).

Evaluation results

A 10 $\mu$m$\phi$ hole was formed with a 3 $\mu$m film thickness, and no crumbling of the hole was observed.

TABLE 1

| | Type of acid dianhydride | Type of diamine component and proportion (mole %) in diamine component | | | | |
|---|---|---|---|---|---|---|
| | | Diamine of formula (3) | | Diamine of formula (2) | Diamine of formula (2) | |
| Ex. 1 | a-BPDA | Diaminopoly-siloxane | 73 | 3,5-diaminobenzoic ethylmethacrylic acid ester | 27 | — |
| Ex. 2 | BTDA | Diaminopoly-siloxane | 73 | 3,5-diaminobenzoic ethylmethacrylic acid ester | 27 | — |
| Ex. 3 | a-BPDA | Diaminopoly-siloxane | 73 | 3,5-diaminobenzyl acrylate | 27 | — |
| Ex. 4 | a-BPDA | Diaminopoly-siloxane | 73 | 4-acrylamido-3,4'-diaminodiphenyl ether | 27 | — |
| Ex. 5 | a-BPDA | Diaminopoly-siloxane | 73 | 3,5-diaminobenzoic ethylmethacrylic acid ester | 14 | 4-acrylamido-3,4'-diaminodiphenyl ether 13 |
| Comp. Ex. 1 | a-BPDA | — | | 3,5-diaminobenzoic ethylmethacrylic acid ester | 100 | — |
| Comp. Ex. 2 | PMDA | Diaminopoly-siloxane | 73 | 3,5-diaminobenzoic ethylmethacrylic acid ester | 27 | — |

TABLE 2

|  | Photosensitive polyimide | | | Cured film Thermal decomposition temperature (° C.) | Photocuring properties | | |
|---|---|---|---|---|---|---|---|
|  | | | | | | Photosensitivity | |
|  | Inherent viscosity (dl/g) | Film formability | Solubility in NMP | | Film thickness ($\mu$m) | Light irradiation (J/cm$^2$) | Resolution (mm$\phi$) |
| Ex. 1 | 0.18 | ○ | * | 375 | 25 | 0.55 | 0.075 |
| Ex. 2 | 0.15 | ○ | ○ | 355 | 23 | 0.50 | 0.075 |
| Ex. 3 | 0.14 | ○ | * | 380 | 24 | 0.45 | 0.10 |
| Ex. 4 | 0.15 | ○ | * | 340 | 21 | 0.90 | 0.20 |
| Ex. 5 | 0.14 | ○ | * | 360 | 25 | 0.85 | 0.15 |
| Comp. Ex. 1 | — | | x | 410 | — | — | — |
| Comp. Ex. 2 | — | | Δ | 390 | — | — | — |

EXAMPLES 7–9 AND COMPARATIVE EXAMPLE 4

The procedures as described in Example 1 were repeated to obtain films of 25 $\mu$m thick, except that no talc was added or the amount of talc was varied. The resolution values evaluated are shown in Table 3 below.

TABLE 3

| Example No. | Amount of talc (phr)* | Resolution (mm$\phi$) |
|---|---|---|
| Comp. Ex. 4 | 0 | 0.4 |
| Ex. 7 | 15 | 0.075 |
| Ex. 8 | 30 | 0.075 |
| Ex. 9 | 40 | 0.075 |

*phr: parts by weight per 100 parts by weight of polymer

The smaller the value (mm$\phi$) for the resolution, the better the resolution.

The photosensitive polyimidosiloxanes according to the present invention have excellent solubility, so that the polyimidosiloxanes in the unexposed portions can be easily removed.

Furthermore, the photosensitive polyimidosiloxanes according to the invention have high photosensitivity, giving them excellent light transmittance and photocrosslinkability.

Photosensitive polyimidosiloxane compositions of the invention may also be formed to large film thicknesses, and with satisfactory photocuring properties of resolution and photosensitivity.

Cured films formed from the photosensitive polyimidosiloxane compositions of the invention also have excellent heat resistance of 300° C. and higher, and even 330° C. and higher, in terms of the thermal decomposition temperature, as well as soldering heat resistance of 250–300° C., film thicknesses of 2–50 $\mu$m, and post-photocuring resolution of at least 10 $\mu$m, and particularly from 10 (thickness of 2 $\mu$m) to 1000 $\mu$m (thickness of 50 $\mu$m).

Cured films formed from the photosensitive polyimidosiloxane compositions of the invention also have excellent mechanical properties, and electrical properties which are superior to epoxy resins as evaluated based on volume resistance, while also having superb flexibility with no cracks produced upon bending.

What is claimed is:

1. A photosensitive polyimidosiloxane composition comprising:

a polyimidosiloxane comprising 15–80 mole percent of the units,

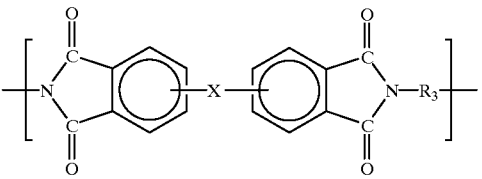

wherein X represents a direct bond and R$_3$ represents an aromatic residue containing a photosensitive group with an unsaturated hydrocarbon group, and 85–20 mole percent of the units,

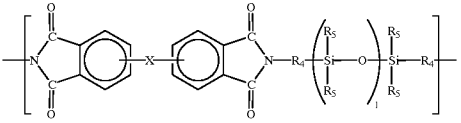

wherein X is as defined above, each R$_4$ independently represents a divalent hydrocarbon residue, each R$_5$ independently represents an alkyl group of 1–3 carbon atoms or a phenyl group and 1 represents an integer of 3–30, a finely divided inorganic filler, and an organic solvent wherein an insulating film of a thickness of 2–50 $\mu$m obtained from said photosensitive polyimidosiloxane composition has a resolution of at least 10 $\mu$m after photocuring by irradiation with a superhigh-pressure mercury lamp (2 kW) on a dried film prepared from said photosensitive polyimidosiloxane composition, immersing the photocured film in a triglyme solvent and washing off the uncured portions, and then washing the surface with methanol to obtain a relief pattern adhering to the polyimide film which is then heat treated at 160° C. for 120 minutes.

2. A photosensitive polyimidosiloxane composition according to claim 1, wherein the finely divided inorganic filler is selected from the group consisting of silica, talc, Wallastonite and calcium carbonate powders.

3. A photosensitive polyimidosiloxane composition according to claim 1, wherein the finely divided inorganic filler is contained in an amount of 10–100 parts by weight per 100 parts by weight of the polyimidosiloxane.

4. A photosensitive polyimidosiloxane composition according to claim 1, wherein the solid concentration consisting of the polyimidosiloxane is 20 to 50 wt %.

5. A photosensitive polyimidosiloxane composition according to claim 1, wherein at least one of a sensitizer, photopolymerization initiator, adhesion-improving agent and air-shutting agent is added in a total amount of 1–50 wt % with respect to the photosensitive polyimidosiloxane.

6. A photosensitive polyimidosiloxane composition according to claim 1, wherein the polyimidosiloxane is prepared by polymerization and imidation of substantially equimolar amounts of:

an aromatic tetracarboxylic dianhydride component represented by the following general formula (1)

$$R_1-X-R_2 \qquad (1)$$

wherein $R_1$ and $R_2$ each represent mononuclear aromatic residues with acid anhydride groups and X represents a direct bond, and a diamine component consisting of 15–80 mole percent of an aromatic diamine compound containing a photosensitive group, represented by the following general formula (2)

$$H_2N-R_3-NH_2 \qquad (2)$$

wherein $R_3$ represents an aromatic residue containing a photosensitive group with an unsaturated hydrocarbon group, and 85–20 mole percent of a diaminopolysiloxane represented by the following general formula (3)

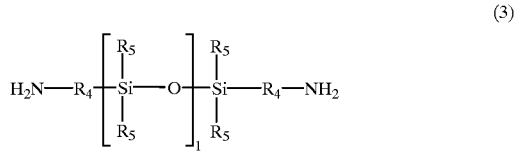

(3)

wherein each $R_4$ independently represents a divalent hydrocarbon residue, each $R_5$ independently represents an alkyl group of 1–3 carbon atoms or a phenyl group and l represents an integer of 3–30.

7. A photosensitive polyimidosiloxane composition according to claim 6, wherein the aromatic tetracarboxylic dianhydride component is 2,3,3',4'-biphenyltetracarboxylic dianhydride.

8. A photosensitive polyimidosiloxane composition according to claim 1, wherein the polyimidosiloxane is prepared by polymerization and imidation of an aromatic tetracarboxylic dianhydride component represented by the general formula (1)

$$R_1-X-R_2 \qquad (1)$$

wherein $R_1$ and $R_2$ each represent mononuclear aromatic residues with acid anhydride groups an X represents a direct bond, an aromatic diamine component having a —OH or —COOH group and diaminopolysiloxane represented by the general formula (3)

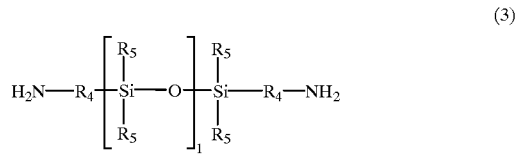

(3)

wherein each $R_4$ independently represents a divalent hydrocarbon residue, each $R_5$ independently represents an alkyl group of 1–3 carbon atoms or a phenyl group and l represents an integer of 3 –30 to form a polyimidosiloxane having a —OH or —COOH group, and reaction of the resulting polyimidosiloxane with a (meth)acryloyl compound.

9. A photosensitive polyimidosiloxane composition according to claim 8, wherein the aromatic diamine component having a —OH or —COOH group is 3,3'-dihydroxy-4,4'-diaminodiphenyl ether or 5,5'-methylene-bis[2-aminobenzoic acid].

10. A photosensitive polyimidosiloxane composition according to claim 8, where the (meth)acryloyl compound is glycidyl methacrylate, glycidyl acrylate or a half-epoxy (meth)acrylate.

11. A photosensitive polyimidosiloxane composition according to claim 1, wherein the insulating film is formed on a circuit board.

12. A photosensitive polyimidosiloxane composition according to claim 1, wherein the insulating film has a soldering heat resistance of 250–300° C.

* * * * *